(12) United States Patent
Aradachi et al.

(10) Patent No.: US 7,800,343 B2
(45) Date of Patent: Sep. 21, 2010

(54) BATTERY CHARGER WITH BATTERY LIFE JUDGING FUNCTION

(75) Inventors: Takao Aradachi, Hitachinaka (JP);
Nobuhiro Takano, Hitachinaka (JP);
Kazuhiko Funabashi, Hitachinaka (JP)

(73) Assignee: Hitachi Koki Co., Ltd., Tokyo (JP)

( * ) Notice: Subject to any disclaimer, the term of this patent is extended or adjusted under 35 U.S.C. 154(b) by 166 days.

(21) Appl. No.: 11/483,741

(22) Filed: Jul. 11, 2006

(65) Prior Publication Data
US 2007/0013344 A1    Jan. 18, 2007

(30) Foreign Application Priority Data
Jul. 12, 2005   (JP) .................. P2005-203509

(51) Int. Cl.
*H02J 7/00*   (2006.01)
(52) U.S. Cl. ....................... 320/132; 324/426
(58) Field of Classification Search ............. 320/132; 324/426–436
See application file for complete search history.

(56) References Cited

U.S. PATENT DOCUMENTS

| | | | | |
|---|---|---|---|---|
| 5,140,251 A | * | 8/1992 | Wu | 320/132 |
| 5,166,623 A | * | 11/1992 | Ganio | 324/427 |
| 5,677,615 A | * | 10/1997 | Takano et al. | 320/152 |
| 5,684,404 A | * | 11/1997 | Millar | 324/426 |
| 5,703,466 A | * | 12/1997 | Honda et al. | 320/152 |
| 6,222,370 B1 | * | 4/2001 | Schousek et al. | 324/436 |

FOREIGN PATENT DOCUMENTS

| | | |
|---|---|---|
| DE | 19952693 | 5/2001 |
| JP | 07-270504 | 10/1995 |

OTHER PUBLICATIONS

Office Action (in German) in DE 19952693, dated Apr. 9, 2009 with English translation.

* cited by examiner

*Primary Examiner*—Edward Tso
*Assistant Examiner*—Samuel Berhanu
(74) *Attorney, Agent, or Firm*—Antonelli, Terry, Stout & Kraus, LLP.

(57) ABSTRACT

A charging device includes a battery voltage detecting circuit for detecting the voltage of a battery pack; and a microcomputer having RAM for temporarily storing a battery voltage detected by the battery voltage detecting circuit, and a CPU for calculating a battery voltage gradient from the battery voltage detected by the battery voltage detecting circuit and a battery voltage sampled a prescribed time earlier. The charging device determines that the life of the battery has expired when the voltage of the battery pack prior to charging is less than or equal to a prescribed value J and the battery voltage gradient within a prescribed time period after the start of charging is greater than or equal to a first prescribed value K. The charging device also includes a display circuit for notifying the user when the life of the battery pack has deteriorated.

6 Claims, 4 Drawing Sheets

BATTERY CHARGER WITH BATTERY LIFE JUDGING FUNCTION

BACKGROUND OF THE INVENTION

1. Field of the Invention

The present invention relates generally to a battery charger for nickel-metal-hydride batteries or other secondary batteries, and more particularly, to a battery life judging device employed in the battery charger.

2. Description of the Related Art

Rechargeable batteries are commonly used as a power supply for portable devices. When a battery in such a device loses its capacitance, the battery is removed from the portable device, charged with a charging device, and subsequently remounted in the portable device. By repeating this process, the rechargeable battery can be used numerous times. However, as the charging/discharging cycle is repeated, the discharge capacity of the battery declines, as shown in FIG. 5. Since the initial properties of the battery deteriorate in this way, there is a limit to the number of times that the battery can be charged and discharged. Conventionally, users have had to determine when the battery life has expired on a case-by-case basis using their own experience or the like. Consequently, there has been demand for a technique to learn when the life of a battery has expired. To meet this demand, Japanese Patent No. 3,336,790 proposes a battery life judging device for determining when the life of a battery has expired based on whether the battery voltage exceeds a prescribed life judging threshold determined corresponding to the number of battery cells making up the battery.

FIG. 6 shows the battery voltage and charge current when charging a battery that operates normally. As shown in FIG. 6, the battery voltage rises gently in the initial charging phase when the battery is charged with a constant level charge current. FIG. 7 shows the battery voltage and charge current when charging a battery that has deteriorated. As shown in FIG. 7, the battery voltage rises abruptly in the initial charging phase when the battery is charged under the same condition as in FIG. 6. Hence, the battery life judging device according to Japanese Patent No. 3336790 determines that the life of this battery has expired because the abrupt voltage rise in the initial phase exceeds the prescribed life judging threshold.

However, since batteries exhibit different voltage behavior according to the type of battery, internal material, manufacturing method, and the like, it is often difficult to judge whether the battery life has expired based simply on whether the battery voltage exceeds the life judging threshold. For example, in some types of batteries, the voltage does not rise abruptly in the initial phase of charging regardless of whether the battery is normal (healthy) or deteriorated. For batteries that exhibit this property, the life of the battery cannot be determined simply by judging whether the battery voltage has exceeded the life judging threshold.

SUMMARY OF THE INVENTION

In view of the foregoing, it is an object of the present invention to provide a battery life judging device capable of reliably determining when the life of a battery has expired, regardless of the type of battery.

It is another object of the present invention to provide a battery life judging device that can easily notify a user when the battery is in a deteriorated state.

The above and others will be attained by a battery life judging device that includes a battery voltage detecting circuit that detects a battery voltage; a memory that stores the battery voltage detected by the battery voltage detecting circuit; a battery voltage gradient calculating unit that calculates a battery voltage gradient from the battery voltage detected by the battery voltage detecting circuit and a battery voltage detected a prescribed time earlier; and a judging unit that judges that a life of a battery has expired when the battery voltage gradient within a prescribed time period after start of charging exceeds a first prescribed value.

The battery life judging device having the construction described above establishes a first prescribed value for a battery voltage gradient and judges that the life of a battery has expired when the battery voltage gradient in the initial charging phase is greater than or equal to the first prescribed value. Therefore, the present invention increases the number of types of batteries for which expiration of life can be determined.

According to another aspect of the invention, there is provided a battery life judging device that includes a battery voltage detecting circuit that detects a battery voltage; a memory that stores the battery voltage detected by the battery voltage detecting circuit; a battery voltage gradient calculating unit that calculates a battery voltage gradient from the battery voltage detected by the battery voltage detecting circuit and a battery voltage detected a prescribed time earlier; and a judging unit that judges that a life of a battery has expired when the battery voltage before start of charging is less than or equal to a prescribed voltage and when the battery voltage gradient within a prescribed time period after the start of charging exceeds a first prescribed value.

The battery life judging device having the construction described above establishes a first prescribed value for a battery voltage gradient and judges that the life of a battery has expired when the battery voltage prior to the start of charging is less than or equal to a prescribed voltage and when the battery voltage gradient in the initial charging phase is greater than or equal to the first prescribed value.

The judging device may determine that the life of a battery has nearly expired when the battery voltage gradient within the prescribed time period after the start of charging is less than the first prescribed value and greater than or equal to a second prescribed value. Here, the second prescribed value is less than the first prescribed value.

The battery life judging device having the construction described above establishes the second prescribed value less than the first prescribed value. The battery life judging device determines that the life of a battery has nearly expired when the battery voltage gradient within a prescribed time period after the start of charging is less than the first prescribed value and greater than or equal to the second prescribed value.

The battery life judging device judges that the battery is healthy when the battery voltage gradient within the prescribed time period after the start of charging is less than the second prescribed value.

It is preferable that the battery life judging device has a display unit that notifies a user of judgment results for the battery. Specifically, the battery life judging device can notify the user via the display unit regarding if the battery life has expired, if the battery life has nearly expired, or if the battery is healthy.

It is further preferable that the display unit emits a first light when the battery is judged to be healthy, a second light when the life of the battery is judged to be nearly expired, and a third light when the life of the battery is judged to be expired. The first light, the second light and the third light are different in color.

According to still another aspect of the invention, there is provided a battery charger that includes a battery voltage detecting circuit that detects a battery voltage; a memory that stores the battery voltage detected by the battery voltage detecting circuit; a microcomputer that implements a battery life judgment based on at least one of a battery voltage gradient within a prescribed time period after start of charging and a battery voltage before the start of charging, and provides judgment results depending on residual length of battery life; and a display unit that indicates the judgment results while emitting lights of different color depending on the residual length of battery life.

The battery charger having the battery life judging functionality can reliably determine the life of various batteries within a short amount of time. The battery charger can also easily notify a user when the state of the battery has deteriorated.

BRIEF DESCRIPTION OF THE DRAWINGS

The particular features and advantages of the invention as well as other objects will become apparent from the following description taken in connection with the accompanying drawings, in which.

DETAILED DESCRIPTION OF THE PREFERRED EMBODIMENTS

Next, a preferred embodiment of the present invention will be described while referring to the accompanying drawings. A battery life judging device according to the preferred embodiment functions to determine when the battery life has expired for a variety of batteries and is provided as an additional function in a charging device used to charge battery packs or the like configured of nickel-cadmium batteries or nickel-metal-hydride batteries.

Figure 1:
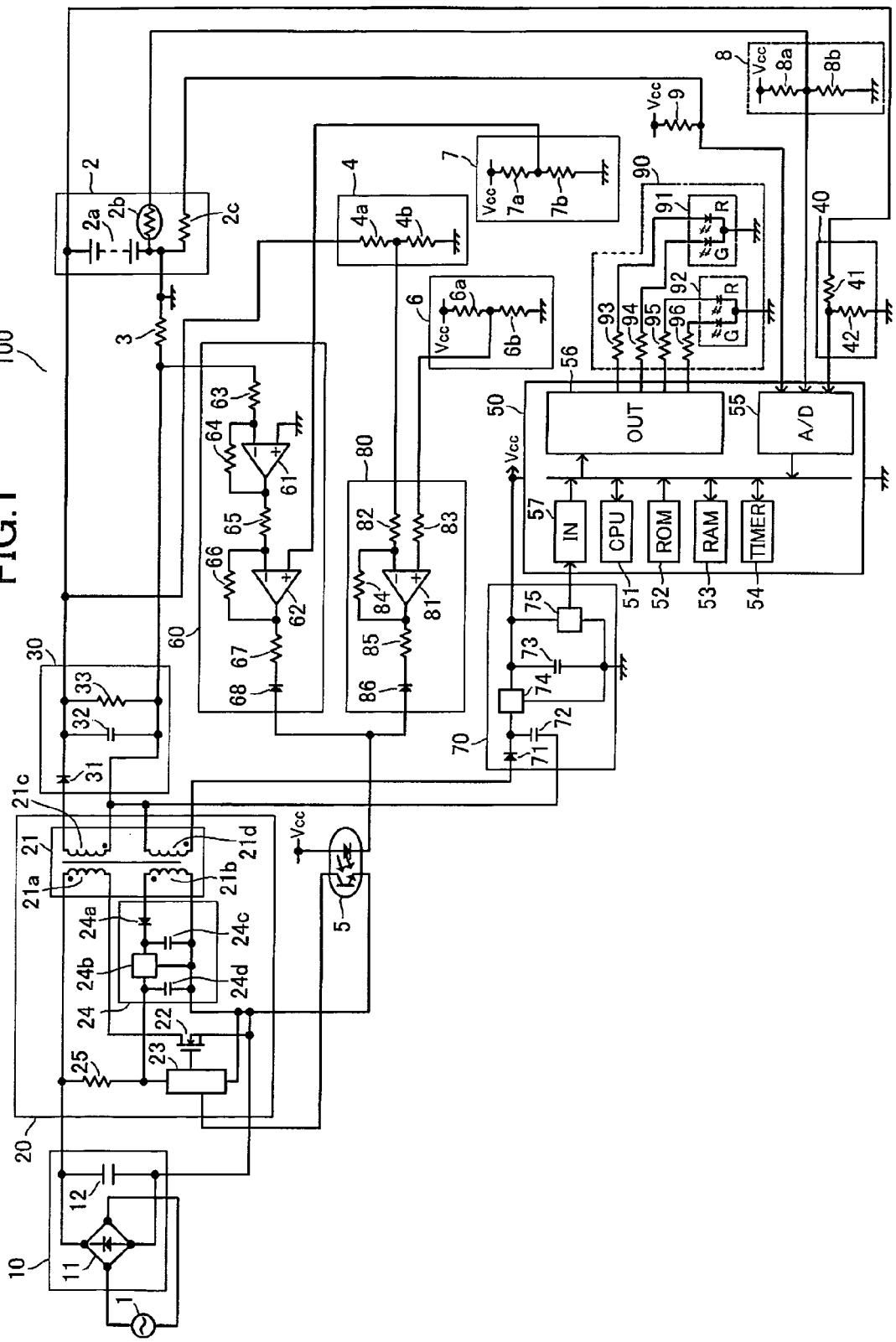
FIG. 1 is a circuit diagram showing the structure of a charging device according to a preferred embodiment of the present invention.

First, a charging device 100 will be described with reference to FIG. 1. The charging device 100 is connected to an AC (alternating current) power source 1 for charging a battery pack 2. The charging device 100 has a power supply circuit configured of a primary rectifying/smoothing circuit 10, a switching circuit 20, and a secondary rectifying/smoothing circuit 30 for supplying power to charge the battery pack 2.

Built inside the battery pack 2 are a battery 2a having a plurality of cells connected in series, a temperature detecting element 2b configured of a thermistor, for example, and disposed in contact with or in proximity of one cell for detecting the temperature of the battery 2a, and a cell number determining resistor 2c having a resistance value corresponding to the number of cells contained in the battery pack 2.

The primary rectifying/smoothing circuit 10 includes a full-wave rectifying circuit 11 and a smoothing capacitor 12. The switching circuit 20 includes a high-frequency transformer 21, a MOSFET 22, an SW controlling IC 23, a constant voltage circuit 24 for the SW controlling IC 23, and a starting resistor 25. The high-frequency transformer 21 includes a primary winding 21a, a secondary winding 21b, a ternary winding 21c, and a quaternary winding 21d. The primary winding 21a functions to apply an input voltage. The secondary winding 21b is an output winding for the SW controlling IC 23. The ternary winding 21c is an output winding for charging the battery pack 2. The quaternary winding 21d is an output winding for a constant voltage circuit 70 that supplies a power source voltage to a microcomputer 50, a charge current controlling circuit 60, and the like. The secondary winding 21b and the quaternary winding 21d are configured with the same polarity as the primary winding 21a, while the ternary winding 21c has reverse polarity.

The SW controlling IC 23 is a switching power supply IC that adjusts the output voltage by changing the width of drive pulses to be applied to the MOSFET 22. The constant voltage circuit 24 includes a diode 24a, a 3-terminal regulator 24b, and capacitors 24c and 24d. The constant voltage circuit 24 converts the voltage outputted from the secondary winding 21b into a constant voltage. The secondary rectifying/smoothing circuit 30 includes a diode 31, a smoothing capacitor 32, and a resistor 33.

In order to maintain the output current from the power supply circuit at constant, the charging device 100 also includes a current detecting resistor 3 for detecting a charge current flowing to the battery pack 2, the charge current controlling circuit 60, and a charge current setting circuit 7. The charge current controlling circuit 60 is connected to a feedback path between the current detecting resistor 3 and the switching circuit 20 via a photocoupler 5. The current detecting resistor 3 detects a charge current flowing to the battery pack 2 and inputs the detected value into the charge current controlling circuit 60. The charging current setting circuit 7 is connected to the charge current controlling circuit 60 for setting a reference current value. The charging current setting circuit 7 is configured of resistors 7a and 7b and sets the voltage determined by the division ratio of these resistors as a reference voltage for setting the charge current.

The charge current controlling circuit 60 includes operational amplifiers 61 and 62, resistors 63 through 67, and a diode 68. The charge current controlling circuit 60 is applied with the charge current flowing to the current detecting circuit 3. The first operational amplifier 61 inversely amplifies the voltage corresponding to this charge current. The second operational amplifier 62 also inversely amplifies the difference between the output voltage from the first operational amplifier 61 and the reference voltage set by the charging current setting circuit 7. The output from the second operational amplifier 62 is fed back to the SW controlling IC 23 via the photocoupler 5. More specifically, the charge current controlling circuit 60 applies pulses of a narrow width when the charge current is large and pulses of a broader width when the charge current is small in order to smoothen the current from the secondary rectifying/smoothing circuit 30 to a direct current and maintain a uniform charge current. In other words, the charge current is controlled via the current detecting circuit 3, charge current controlling circuit 60, charging current setting circuit 7, photocoupler 5, switching circuit 20, and secondary rectifying/smoothing circuit 30 to produce the set current value.

In order to maintain the output voltage from the power supply circuit at constant, the charging device 100 includes an output voltage detecting circuit 4, an output voltage control circuit 80, and an output voltage setting circuit 6. The output voltage control circuit 80 is connected to a feedback path between the output voltage detecting circuit 4 and the switching circuit 20 via the photocoupler 5. The output voltage detecting circuit 4 is configured of resistors 4a and 4b that divide the voltage outputted from the secondary rectifying/smoothing circuit 30 of the power supply circuit, and inputs the resultant divided voltage into the output voltage control circuit 80. The output voltage setting circuit 6 is connected to the output voltage control circuit 80 for setting a reference voltage. The output voltage setting circuit 6 is configured of resistors 6a and 6b and sets the voltage determined by the division ratio of the resistors 6a and 6b as a reference voltage for comparison with the voltage outputted from the secondary rectifying/smoothing circuit 30. The photocoupler 5 is used as a signal transmitting means provided for feeding back the output voltage of the secondary rectifying/smoothing circuit 30 and a charge current to the SW controlling IC 23.

The output voltage control circuit 80 includes an operational amplifier 81, resistors 82 through 85, and a diode 86. The output voltage control circuit 80 amplifies the difference between the voltage from the output voltage detecting circuit 4 and the voltage from the output voltage setting circuit 6 and feeds this difference back to the SW controlling IC 23 via the photocoupler 5 to control the output voltage of the secondary rectifying/smoothing circuit 30. More specifically, the output voltage control circuit 80 applies pulses having a narrow width when the output voltage is large and pulses having a broader width when the output voltage is small to the high-frequency transformer 21 in order to smoothen the output voltage from the secondary rectifying/smoothing circuit 30 and to maintain a uniform output voltage. In other words, the output voltage is controlled to the set output value via the output voltage detecting circuit 4, output voltage control circuit 80, output voltage setting circuit 6, photocoupler 5, switching circuit 20, and secondary rectifying/smoothing circuit 30.

The charging device 100 also has a battery voltage detecting circuit 40, a battery temperature detecting circuit 8, and a cell number determining circuit 9. The battery voltage detecting circuit 40 is configured of resistors 41 and 42 for dividing the terminal voltage of the battery pack 2 and inputting the divided voltage into an A/D converter 55 of the microcomputer 50.

The battery temperature detecting circuit 8 is configured of resistors 8a and 8b and inputs a divided voltage determined by a division ratio of the resistors 8a and 8b and temperature sensor 2b into the A/D converter 55 of the microcomputer 50. A divided voltage determined depending on the battery temperature can be inputted into the A/D converter 55 of the microcomputer 50 since the resistance value of the temperature detecting element 2b changes according to changes in the temperature of the battery 2a.

The cell number determining circuit 9 is configured of a resistor for inputting a divided voltage of the cell number determining resistor 2c into the A/D converter 55 of the microcomputer 50. The cell number determining resistor 2c has a different resistance value depending on the number of cells making up the battery 2a.

The microcomputer 50 has an arithmetic circuit (CPU) 51, a ROM 52, a RAM 53, a timer 54, the A/D converter 55, an output port (OUT) 56, and a reset input port (IN) 57. The microcomputer 50 stores the battery voltage inputted into the A/D converter 55 at prescribed sampling intervals in the RAM 53, and the CPU 51 computes a battery voltage gradient based on the current battery voltage and the battery voltage determined a prescribed time earlier.

The charging device 100 also includes the constant voltage circuit 70 having a diode 71, capacitors 72 and 73, a 3-terminal regulator 74, and a reset IC 75. The constant voltage circuit 70 serves as a power supply for the microcomputer 50, the charging current controller 60, and the like. The reset IC 75 outputs a reset signal to the reset input port 57 in order to reset the microcomputer 50 to an initialized state.

The charging device 100 further includes a display circuit 90 having LEDs 91 and 92 and resistors 93 through 96. The LEDs 91 and 92 are each capable of emitting both red light and green light and can be controlled through output from the output port 56 of the microcomputer 50 to produce red and green light, as well as orange light when emitting light simultaneously in red and green. In the preferred embodiment, the LED 91 is lit in red prior to beginning the charging process and is lit in green upon completion of the charging process. The LED 92 indicates the battery life as one of three levels during the life judging process, using orange to indicate the battery is healthy, red to indicate the battery life has expired, and green to indicate the battery life has nearly expired.

Next, a battery life judging operation executed by the charging device 100 will be described with reference to the circuit diagram in FIG. 1, the graphs of battery voltage and charge current in FIGS. 2 and 3, and the flowchart in FIG. 4. When the power of the charging device 100 is turned on, in S701 of FIG. 4 the microcomputer 50 flashes the LED 91 in red via the output port 56 to indicate that charging has not yet begun. In S702 the microcomputer 50 enters a standby state to wait for the battery pack 2 to be connected. Connection of the battery pack 2 can be determined based on a signal from the battery voltage detecting circuit 40, battery temperature detecting circuit 8, or cell number determining circuit 9.

When a battery pack 2 has been connected (S702: YES), in S703 the microcomputer 50 reads a pre-charging battery voltage V0 into the RAM 53 via the A/D converter 55. In S704 the microcomputer 50 begins charging the battery pack 2 at a prescribed charge current I. The microcomputer 50 controls the charge current by using the current detecting resistor 3 to detect the charge current flowing to the battery pack 2 at the start of charging and using the charge current controlling circuit 60 to feedback the difference between the voltage corresponding to the detected charge current and the reference voltage V from the charging current setting circuit 7 to the SW controlling IC 23 via the photocoupler 5. Specifically, the microcomputer 50 reduces the pulse width applied to the high-frequency transformer 21 when the charge current is large and increases the pulse width when the charge current is small in order to smoothen the charge current to a direct current in the secondary rectifying/smoothing circuit 30 and to maintain a uniform charge current. In this way, the microcomputer 50 adjusts the charge current via the current detecting resistor 3, charge current controlling circuit 60, photocoupler 5, switching circuit 20, and secondary rectifying/smoothing circuit 30 to achieve the prescribed charge current I.

After charging begins, the microcomputer 50 shuts off the LED 91 via the output port 56 in S705. In S706 the microcomputer 50 flashes the LED 92 in orange to indicate that a process is being performed to determine the battery life. In S707 the microcomputer 50 starts the timer 54, in S708 waits for a sampling time to elapse, and in S709 restarts the timer 54. In S710 the microcomputer 50 extracts via the A/D converter 55 a value resulting from dividing the terminal voltage by the resistors 41 and 42 in the battery voltage detecting circuit 40 as a battery voltage Vin.

In S711 the microcomputer 50 determines whether a battery voltage Vt sampled a prescribed time t after the start of charging is stored in the RAM 53 of the microcomputer 50. If the battery voltage Vt is stored in the RAM 53 (S711: YES), then the microcomputer 50 jumps to S714. If not (S711: NO), then in S712 the microcomputer 50 determines whether the prescribed time t has elapsed since the start of charging.

If the time t has not elapsed since the start of charging (S712: NO), then in S723 the microcomputer 50 determines whether the battery pack 2 is fully charged. However, if the prescribed time t has elapsed (S712: YES), then in S713 the microcomputer 50 stores the current battery voltage Vin as the battery voltage Vt sampled at the prescribed time t after the start of charging in the RAM 53 of the microcomputer 50.

In S714 the microcomputer 50 determines whether a battery voltage VT sampled a prescribed time T (T>t) after the start of charging is stored in the RAM 53 of the microcomputer 50. In the preferred embodiment, the time T is set to 1 minute, while the time t is set to 30 seconds. However, the times T and t are not limited to these values and may be set as appropriate. If the battery voltage VT is stored in the RAM 53 (S714: YES), then in S723 the microcomputer 50 determines whether the battery 2a is fully charged. However, if the battery voltage VT is not stored in the RAM 53 (S714: NO), then in S715 the microcomputer 50 determines whether the prescribed time T has elapsed since the start of charging.

If the time T has not elapsed since the start of charging (S715: NO), then in S723 the microcomputer 50 determines whether the battery 2a is fully charged. However, if the prescribed time T has elapsed (S715: YES), then in S716 the microcomputer 50 stores the current battery voltage Vin in the RAM 53 of the microcomputer 50 as the battery voltage VT sampled at the prescribed time T after the start of charging.

In S717 the microcomputer 50 determines whether the pre-charging battery voltage V0 stored in the RAM 53 of the microcomputer 50 is greater than or equal to a prescribed value J. The pre-charging battery voltage V0 is compared to the prescribed value J to determine whether the battery still has a degree of capacitance. This determination is performed before subsequent determinations in S718 and S719 described next for determining whether the battery life has expired or is near expiration when the battery voltage gradient computed by the CPU 51 is greater than or equal to a first prescribed value or a second prescribed value, respectively, because the battery voltage gradient during charging may be too large when a degree of capacitance remains in the battery. In such a case, it is not always possible to determine whether the battery life has expired or is near expiration, even if the battery voltage gradient is greater than or equal to the first prescribed value or the second prescribed value. Hence, in S717 the microcomputer 50 determines whether a degree of capacitance remains in the battery.

If the pre-charging battery voltage V0 is greater than or equal to the prescribed value J (S717: YES), then the microcomputer 50 jumps to S722. However, if the pre-charging battery voltage V0 is less than prescribed value J (S717: NO), then the CPU 51 of the microcomputer 50 calculates a battery voltage gradient V(T−t) by subtracting the battery voltage Vt from the battery voltage VT stored in the RAM 53 and determines whether this result is greater than or equal to a first prescribed value K serving as a battery life judging value.

Next, the dependency of the battery voltage and charge current on charging time will be described for one type of battery, both in a healthy state and a deteriorated state. FIG. 2 shows the battery voltage and charge current when charging a healthy battery. FIG. 3 shows the battery voltage and charge current when charging the same battery in FIG. 2 that has deteriorated. In both FIGS. 2 and 3, the X-axis represents the charge time tc, while the Y-axis represents both the battery voltage Vin and the charge current I.

Figure 2:
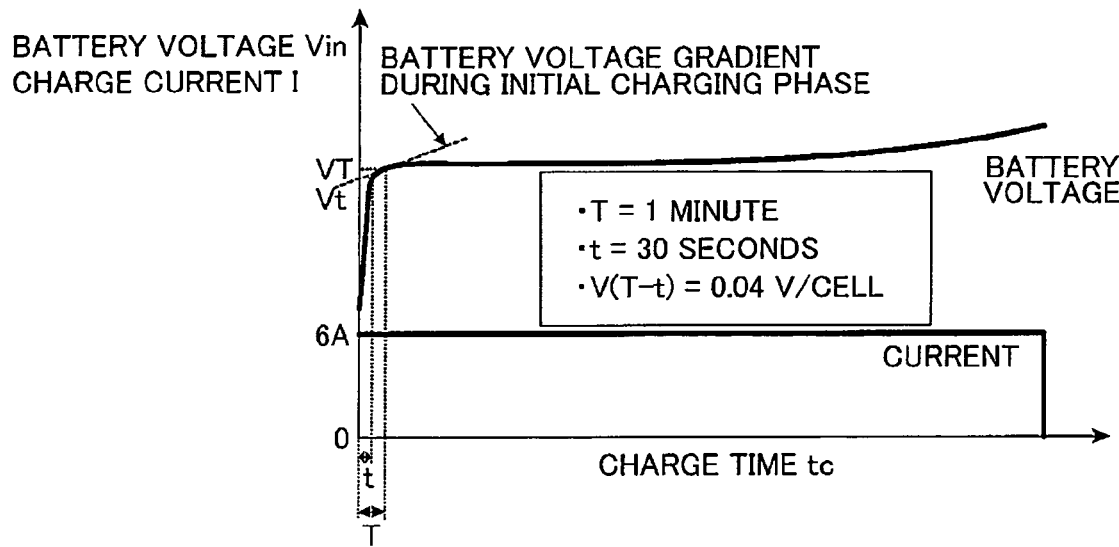
FIG. 2 is a graph showing the dependency of the battery voltage and charge current to charging time for a healthy battery.
Figure 3:
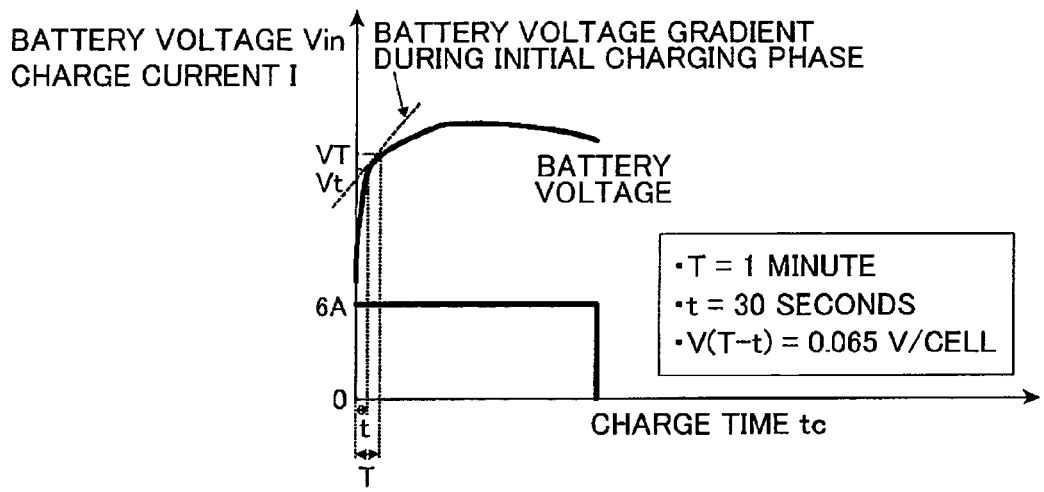
FIG. 3 is a graph showing the dependency of the battery voltage and charge current to charging time for the battery in FIG. 2 that has deteriorated.
Figure 4:
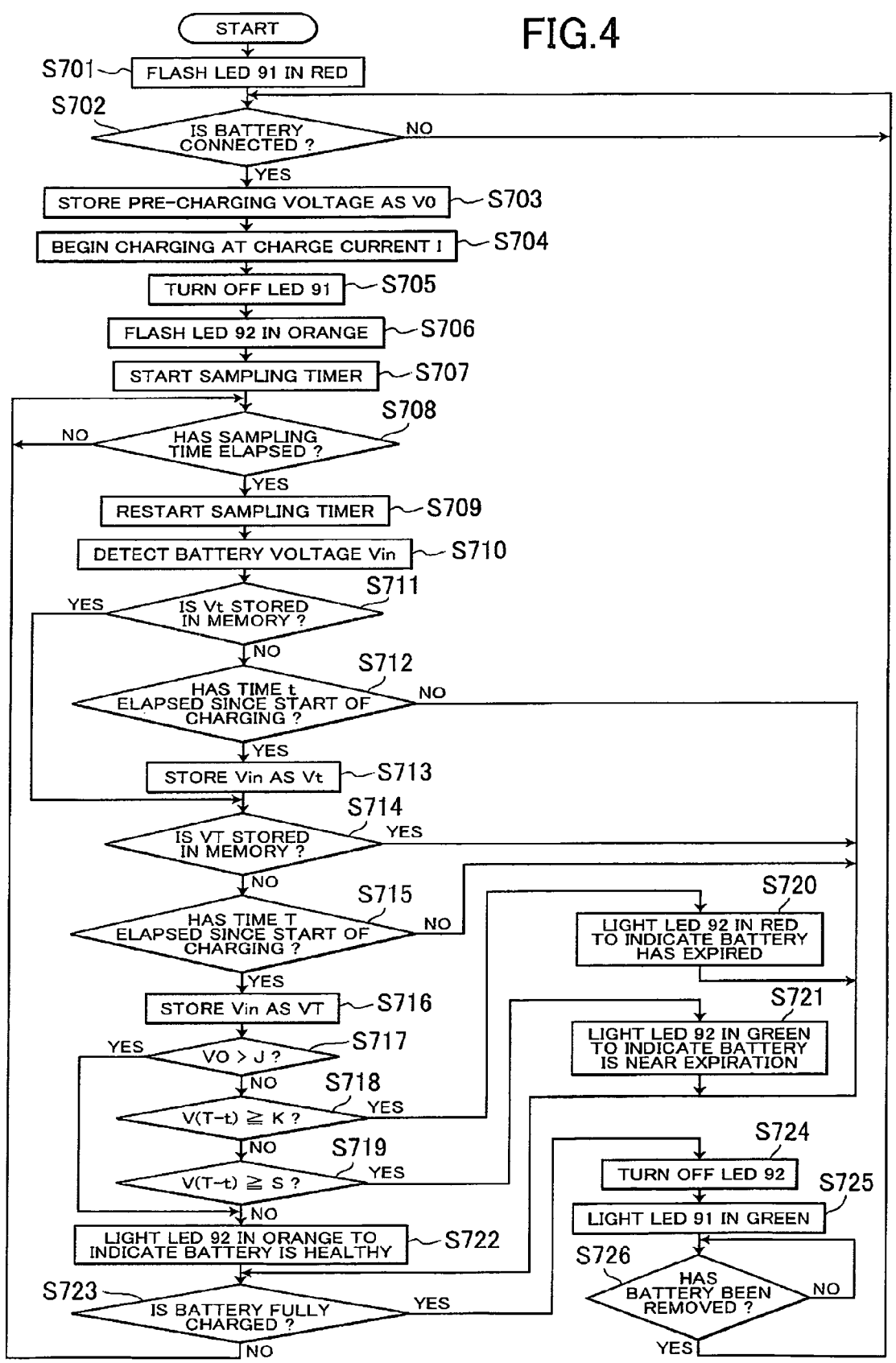
FIG. 4 is a flowchart illustrating the operations of the charging device according to the preferred embodiment.
Figure 5:
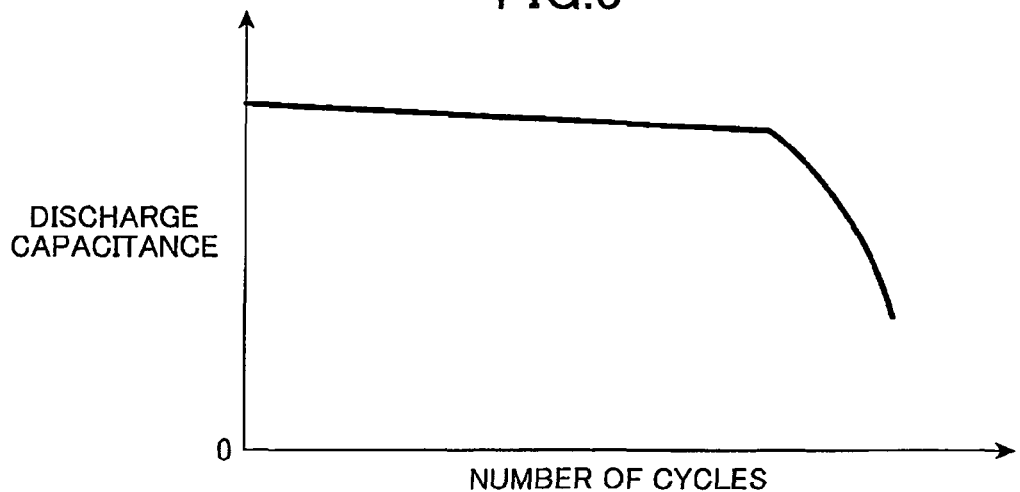
FIG. 5 is a graph illustrating the charging/discharging cycle life of a battery.
Figure 6:
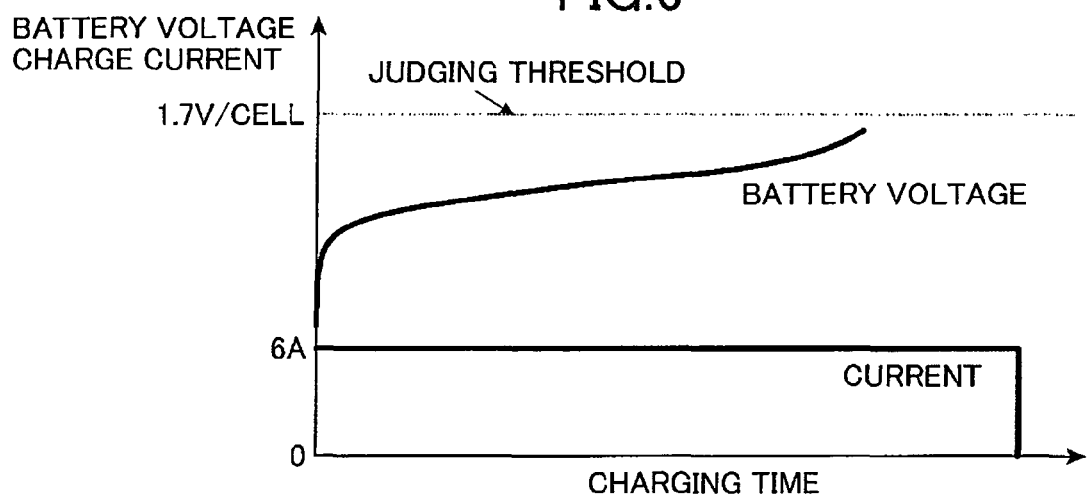
FIG. 6 is a graph showing the dependency of the battery voltage and charge current to charge time for one type of healthy battery.
Figure 7:
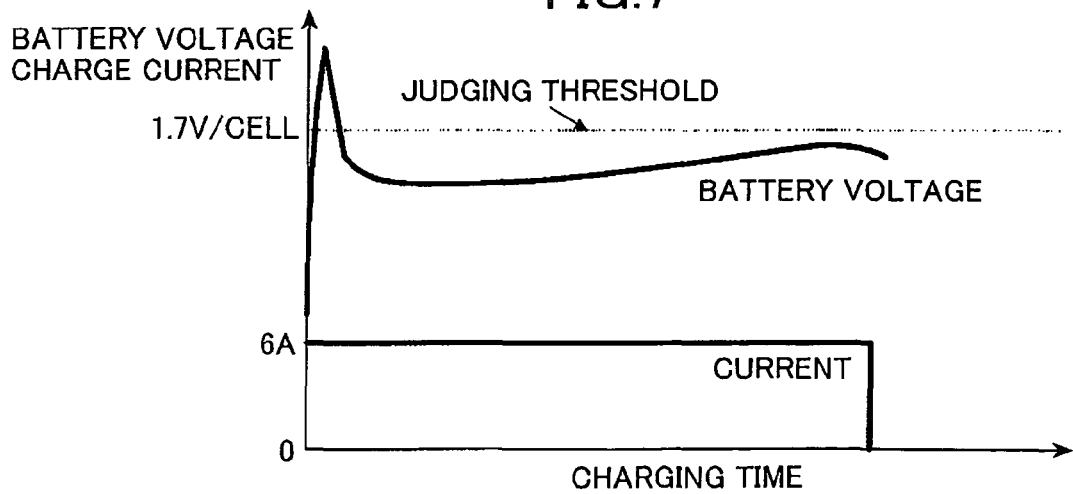
FIG. 7 is a graph showing the dependency of the battery voltage and charge current to charge time for the same type of battery in FIG. 6 that has deteriorated.

As shown in FIGS. 2 and 3, neither the healthy battery nor the deteriorated battery exhibits an abrupt rise in voltage during the initial charging phase. However, certain types of batteries that have reached the end of their life exhibit a high battery voltage gradient in the initial charging phase, while healthy batteries of the same type exhibit a lower battery voltage gradient. Accordingly, the first prescribed value K is set and compared to the battery voltage gradient to determine whether the battery has expired. In the preferred embodiment, the first prescribed value K is set to a value of 0.06 V/cell. However, the first prescribed value K is not limited to this value and may be set as appropriate.

If the battery voltage gradient V(T−t) is greater than or equal to this first prescribed value K (0.06 V/cell; S718: YES), that is, when the battery voltage gradient V(T−t) is 0.065 V/cell as shown in FIG. 3, the microcomputer 50 determines that the battery life has expired. Accordingly, in S720 the microcomputer 50 lights the LED 92 in red via the output port 56 to indicate that the battery has expired.

However, if the battery voltage gradient V(T−t) is less than the first prescribed value K (S718: NO), then in S719 the microcomputer 50 determines whether the battery voltage gradient V(T−t) is greater than or equal to a second prescribed value S (K>S) serving as a value for judging when the battery is near expiration. In the preferred embodiment, the second prescribed value S is set to the value 0.05 V/cell. However, the second prescribed value S is not limited to this value and may be set as appropriate. If the battery voltage gradient V(T−t) is greater than or equal to the second prescribed value S (S719: YES), then the microcomputer 50 determines that the battery is near expiration and in S721 lights the LED 92 in green via the output port 56 to indicate that the battery is near expiration.

However, if the battery voltage gradient V(T−t) is less than the second prescribed value S (0.05 V/cell), that is, when the battery voltage gradient V(T−t) is 0.04 V/cell, as in FIG. 2, then the microcomputer 50 determines that the battery is healthy and in S722 lights the LED 92 in orange via the output port 56 to indicate that the battery is healthy. Subsequently, the microcomputer 50 determines in S723 whether the battery is fully charged.

There are various conventional methods for determining whether the battery pack 2 is fully charged. For example, a −ΔV detection method determines that the battery is fully charged based on output from the battery voltage detecting circuit 40 when the voltage drops a prescribed amount from a peak voltage during charging. In a second-order differential method, charging is halted before the battery voltage reaches its peak to reduce overcharging with the aim of increasing the cycle life of the battery, and the battery is determined to be fully charged when a second order time differential value of the battery voltage is negative. Further, a ΔT detection method determines that a battery is fully charged based on output from the battery temperature sensor 8 by detecting when the temperature rise of the battery exceeds a prescribed value after the start of charging.

Further, a dT/dt detection method and the like disclosed in Japanese unexamined patent application publications Nos. SHO-62-193518 and HEI-2-246739 and Japanese unexamined utility model application publication No. HEI-3-34638 is used to determine when a battery has become fully charged by detecting when the rate of battery temperature increase (temperature gradient) at a prescribed time during charging exceeds a prescribed value. The charging device 100 of the preferred embodiment may use any one or a plurality of these detection methods.

If the battery is determined to be fully charged (S723: YES), then in S724 the microcomputer 50 shuts off the LED 92 via the output port 56 and in S725 lights the LED 91 in green to indicate that charging has completed. Subsequently, the microcomputer 50 determines in S726 whether the battery pack 2 has been removed from the charging device 100 and returns to S702 when the battery pack 2 has been removed. However, if the microcomputer 50 determines in S723 that the battery is not fully charged (S723: NO), then the microcomputer 50 returns to S708.

As described above, the charging device 100 of the preferred embodiment measures the voltage of the battery pack 2 prior to charging and compares this voltage to the prescribed value J. The charging device 100 also measures a battery voltage gradient from a prescribed time (such as 30 seconds) after beginning the charging process until one minute later and compares this gradient with the first prescribed value K and the second prescribed value S. If the voltage is determined to be less than or equal to the prescribed value J and the battery voltage gradient is determined to be greater than or equal to the first prescribed value K, then the microcomputer 50 determines that the life of the battery pack 2 has expired and lights the LED 92 in red. When the voltage is less than or equal to the prescribed value J and the battery voltage gradient is greater than or equal to the second prescribed value S but less than the first prescribed value K, then the microcomputer 50 determines that the battery pack 2 is near expiration and lights the LED 92 in green. Further, when the voltage is less than or equal to the prescribed value J and the battery voltage gradient is less than the second prescribed value S, then the microcomputer 50 determines that the battery pack 2 is healthy and lights the LED 92 in orange. In this way, the charging device 100 can reliably determine the life of the battery set in a short amount of time and can visually notify the user of this battery state.

While the battery life judging device of the present invention has been described in detail with reference to specific embodiments thereof, it would be apparent to those skilled in the art that many modifications and variations may be made therein without departing from the spirit of the invention, the scope of which is defined by the attached claims. For example, in the preferred embodiment described above, the threshold for determining when the battery has expired is set to K=0.06 V/cell, while the threshold for determining when the battery has neared expiration is set to S=0.05 V/cell. However, since the battery voltage gradient tends to be higher at lower temperatures, it is possible to adjust the threshold values based on the charging temperature of battery at the start of the charging process. For example, when the battery temperature is 10° C. or less, the threshold values may be set to about 1.3 times those in the preferred embodiment. In other words, the threshold values are not limited to the values described above.

Further, another prescribed value (third prescribed value) for the battery voltage gradient that is the same as or different from the first prescribed value K may be provided, and the microcomputer may determine that the life of the battery has expired when the battery voltage gradient is greater than or equal to the third prescribed value and that the battery has neared expiration when the battery voltage gradient is greater than or equal to the second prescribed value S and less than the third prescribed value, regardless of whether the pre-charging battery voltage V0 is less than or equal to the prescribed value J. In this case, the prescribed value can be adjusted according to the type of battery, measuring environment, and the like.

The battery life judging device of the present invention can be used for judging the life of a battery employed in power tools, for example.

What is claimed is:

1. A battery life judging device comprising:
   a battery voltage detecting unit that detects a first battery voltage before charging of a battery begins and second battery voltages at a first time and at a second time subsequent to the first time, wherein both said first time and said second time are subsequent to a time when charging of the battery begins;
   a memory that stores the first battery voltage and the second battery voltage detected by the battery voltage detecting unit;
   a battery voltage gradient calculating unit that calculates a battery voltage gradient from the second battery voltages detected by the battery voltage detecting circuit at said first and second times; and
   a judging unit including first means for judging if the first battery voltage exceeds a predetermined voltage and second means for judging if the battery voltage gradient exceeds a first prescribed value,
   wherein the judging unit judges that a life of a battery has expired when the first battery voltage does not exceed the predetermined voltage and the battery voltage gradient exceeds a first prescribed value.

2. The battery life judging device according to claim 1, further comprising a display unit that notifies a user of judgment results for the battery.

3. The battery life judging device according to claim 2, wherein the display unit emits a first light when the battery is judged to be healthy, a second light when the life of the battery is judged to be nearly expired, and a third light when the life of the battery is judged to be expired, wherein the first light, the second light and the third light are different in color.

4. The battery life judging device according to claim 1, wherein the judging unit further includes means for judging if the battery voltage gradient exceeds a second prescribed value which is less than the first prescribed value, and
   wherein the judging unit determines that the life of a battery has nearly expired when the battery voltage gradient within the prescribed time period after the start of charging is less than the first prescribed value and greater than or equal to a second prescribed value.

5. The battery life judging device according to claim 1 wherein the judging unit further includes means for judging if the battery voltage gradient exceeds a second prescribed value which is less than the first prescribed value, and
   wherein the judging unit determines that the battery is healthy when the battery voltage gradient within the prescribed time period after the start of charging is less than the second prescribed value.

6. A battery life judging device comprising:
   a battery voltage detecting unit that detects a first battery voltage before charging of a battery begins and second battery voltages at a first time and at a second time subsequent to the first time, wherein both said first time and said second time are subsequent to a time when charging of a battery begins;
   a memory that stores the first battery voltage and the second battery voltage detected by the battery voltage detecting unit;

a battery voltage gradient calculating unit that calculates a battery voltage gradient from the second battery voltages detected by the battery voltage detecting circuit at said first and second times; and a microcomputer that implements a battery life judgment which includes first means for judging if the first battery voltage exceeds a predetermined voltage and second means for judging if the battery voltage gradient exceeds a first prescribed value, wherein the judging unit judges that a life of a battery has expired when the first battery voltage does not exceed the predetermined voltage and the battery voltage gradient exceeds a first prescribed value, and wherein a display unit indicates the judgment results while emitting lights of different color depending on the residual length of battery life.

* * * * *